United States Patent
Groom et al.

(10) Patent No.: US 8,659,038 B2
(45) Date of Patent: Feb. 25, 2014

(54) SEMICONDUCTOR LIGHT SOURCE AND METHOD OF FABRICATION THEREOF

(75) Inventors: Kristian Groom, Sheffield (GB); Richard Hogg, Sheffield (GB)

(73) Assignee: The University of Sheffield, Sheffield (GB)

( * ) Notice: Subject to any disclaimer, the term of this patent is extended or adjusted under 35 U.S.C. 154(b) by 0 days.

(21) Appl. No.: 13/375,723

(22) PCT Filed: Jun. 9, 2010

(86) PCT No.: PCT/GB2010/050967
§ 371 (c)(1),
(2), (4) Date: Feb. 10, 2012

(87) PCT Pub. No.: WO2010/142988
PCT Pub. Date: Dec. 16, 2010

(65) Prior Publication Data
US 2012/0146068 A1    Jun. 14, 2012

(30) Foreign Application Priority Data
Jun. 10, 2009  (GB) .................................. 0909971.4

(51) Int. Cl.
*H01L 33/00* (2010.01)
*H01S 3/04* (2006.01)
*H01S 5/00* (2006.01)
*H01S 3/00* (2006.01)

(52) U.S. Cl.
USPC ............ 257/94; 257/E33.067; 372/43.01; 372/44.01; 372/45.01; 372/46.01; 359/344

(58) Field of Classification Search
None
See application file for complete search history.

(56) References Cited

U.S. PATENT DOCUMENTS

| 4,791,635 A | 12/1988 | Schairer |
| 5,008,889 A * | 4/1991 | Wilson ............................ 372/32 |

(Continued)

FOREIGN PATENT DOCUMENTS

| EP | 0674368 A2 | 6/2000 |
| EP | 1052747 A2 | 11/2000 |

(Continued)

OTHER PUBLICATIONS

Athina Nickitas-Etienne and Denis Herve, International Preliminary Report on Patentability (PCT/GB2010/050967), Dec. 12, 2011, 8 pages, European Patent Office as International Search Authority, International Bureau of WIPO, Munich, Germany.

(Continued)

*Primary Examiner* — Julio J Maldonado
*Assistant Examiner* — Harpreet Singh
(74) *Attorney, Agent, or Firm* — Crain, Caton & James (57) ABSTRACT

Embodiments of the present invention provided a method of fabricating a semiconductor light source structure. The method comprises providing a GaAs substrate; forming a lower cladding layer above the substrate, the lower cladding layer comprising an $Al_xGa_{1-x}As$ alloy; forming an active region above the lower cladding layer, the active region comprising a GaAs separate confinement heterostructure; and forming an upper cladding layer comprising an $Al_xGa_{1-x}As$ alloy above the active region in the form of an elongate stripe bounded on either side by an InGaP current-blocking layer, the elongate stripe defining an index-guided optical waveguide. The stripe is formed such that at least one free end of the stripe is spaced apart from an edge of the substrate in a direction parallel to a longitudinal axis of the stripe such that a portion of the lower cladding layer, active region, current blocking layer and upper cladding layer extend beyond the at least one free end of the stripe thereby to provide an unpumped and laterally unguided window region.

27 Claims, 5 Drawing Sheets

(56) References Cited

U.S. PATENT DOCUMENTS

| | | | |
|---|---|---|---|
| 5,541,950 A * | 7/1996 | Kizuki et al. | 372/46.01 |
| 5,985,685 A | 11/1999 | Lealman et al. | |
| 6,040,590 A * | 3/2000 | OBrien et al. | 257/94 |
| 6,304,587 B1 * | 10/2001 | Zah | 372/46.01 |
| 2002/0171094 A1 * | 11/2002 | Koiso et al. | 257/200 |
| 2003/0039289 A1 | 2/2003 | Ohgoh et al. | |

FOREIGN PATENT DOCUMENTS

| | | |
|---|---|---|
| GB | 2471266 B | 7/2013 |
| JP | 5175611 A | 7/1993 |
| JP | 2000252583 A | 9/2000 |
| JP | 2001057459 A | 2/2001 |

OTHER PUBLICATIONS

Cha, 1.5 µm Band traveling-wave semiconductor optical amplifier with window facet structure, Electronics Letters, Aug. 31, 1989, 4 pages, vol. 25, No. 13, Stevenage, United Kingdom.

Denis Herve, International Search Report (PCT/GB2010/050967), Oct. 13, 2010, 4 pages, European Patent Office as International Search Authority, Rjiswijk, The Netherlands.

Thomas Britland, Search Report of Nov. 19, 2009—GB0909971, Nov. 19, 2009, 1 page, Intellectual Property Office (United Kingdom), Newport, South Wales, United Kingdom.

Jorge Quintero, Examination Report of Jan. 22, 2013—GB0909971.4, Jan. 22, 2013, 4 pages, Intellectual Property Office (United Kingdom), Newport, South Wales, United Kingdom.

Vincent Jennings, Reply on Mar. 21, 2013 to Examination Report of Jan. 22, 2013—GB0909971.4 with amended claims and claims showing changes made, May 21, 2013, 12 pages, Harrison, Goddard Foote, Sheffield, United Kingdom.

Jorge Quintero, Examination Report of Apr. 9, 2013—GB0909971.4, Apr. 9, 2013, 2 pages, Intellectual Property Office (United Kingdom), Newport, South Wales, United Kingdom.

Vincent Jennings, Reply on May 21, 2013 to Examination Report of Apr. 9, 2013—GB0909971.4 with amended claims, amended description, and versions showing changes made, May 21, 2013, 19 pages, Harrison, Goddard Foote, Sheffield, United Kingdom.

Sean Dennehey, Notification of Grant of Jun. 11, 2013—GB0909971.4, Jun. 11, 2013, 2 pages, Intellectual Property Office (United Kingdom), Newport, South Wales, United Kingdom.

John Alty, Certificate of Grant of Jul. 10, 2013—GB0909971.4, Jul. 10, 2013, 3 pages, Intellectual Property Office (United Kingdom), Newport, South Wales, United Kingdom.

* cited by examiner

SEMICONDUCTOR LIGHT SOURCE AND METHOD OF FABRICATION THEREOF

FIELD OF THE INVENTION

The present invention relates to semiconductor light sources and to a method of fabricating a semiconductor light source.

BACKGROUND

Superluminescent diodes (SLDs) and semiconductor optical amplifiers (SOAs) are opto-electronic devices that provide amplified spontaneous emission of radiation. The devices may be formed by providing a laser cavity structure defining a waveguide that is bounded at opposed longitudinal ends by low reflectivity surfaces. The reflectivity of the surfaces must be sufficiently low to suppress lasing in the cavity.

K. Tateoka et al, "A High Power GaAlAs Superluminescent Diode with an Antireflective Window Structure" (IEEE J. Quantum Electronics Vol 27 No 6 June 1991 pages 1568 to 1573) discloses providing a buried twin ridge substrate (BTRS) structure as part of an SLD structure. An antireflection (AR) coating is provided at a front end of the structure. At a rear end of the structure a window region is provided. The window region is provided by etching through a portion of an active layer of the BTRS structure, forming a current blocking layer, and subsequently regrowing a GaAlAs window region. The GaAlAs window region is arranged to have a mode index to match that of the waveguide.

Figure 1:
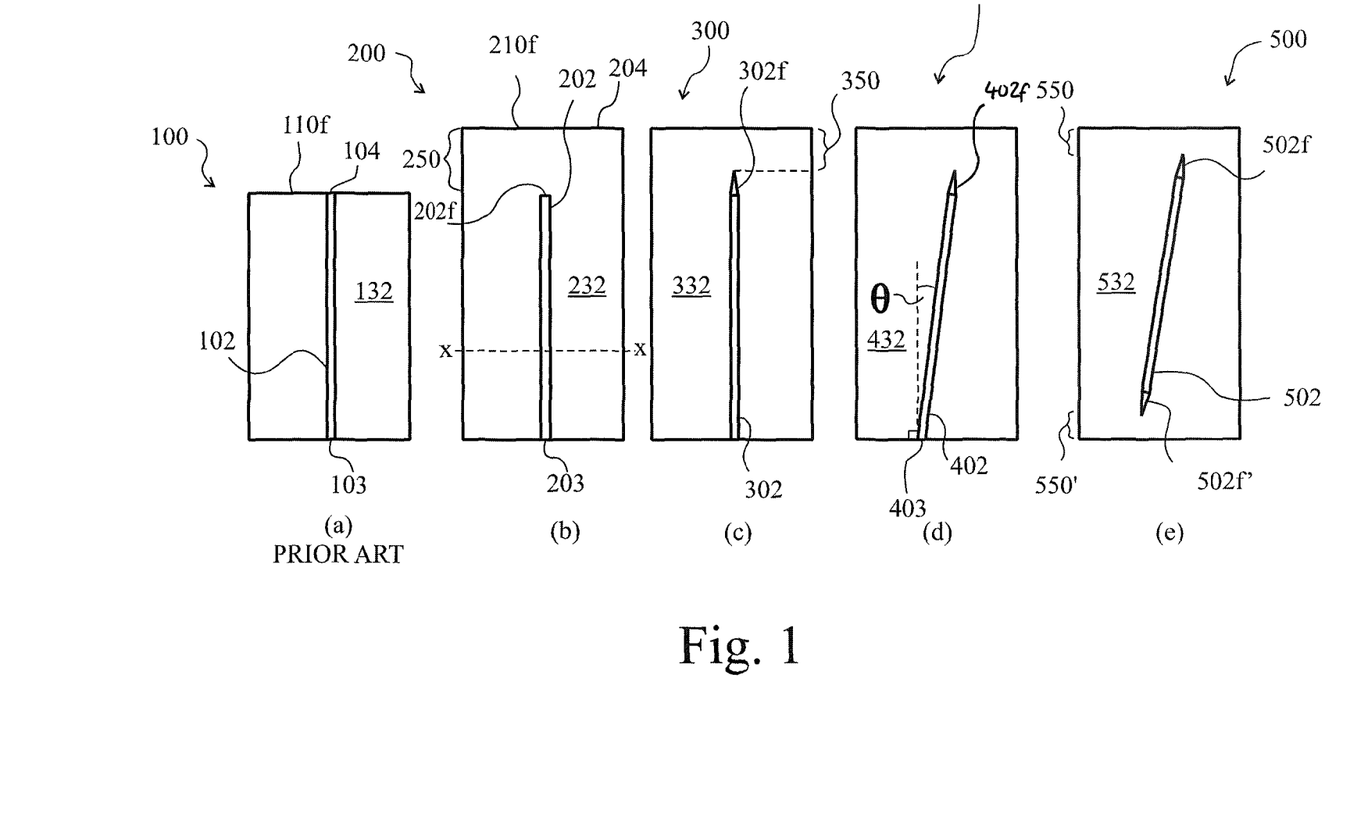
FIG. 1 shows (a) a prior art self-aligned stripe semiconductor laser structure and (b) to (e) structures according to embodiments of the present invention.

FIG. 1(a) is a schematic illustration of a known semiconductor laser structure 100 having a laser cavity defined by a self-aligned stripe (SAS) structure 102. The SAS structure 102 is bounded at opposed longitudinal ends by reflective surfaces 103, 104 also referred to as 'mirrors'.

STATEMENT OF THE INVENTION

In a first aspect of the present invention there is provided a method of fabricating a semiconductor light source structure comprising:
  providing a GaAs substrate;
  forming a lower cladding layer above the substrate, the lower cladding layer comprising an $Al_xGa_{1-x}As$ alloy;
  forming an active region above the lower cladding layer, the active region comprising a GaAs separate confinement heterostructure;
  forming an upper cladding layer comprising an $Al_xGa_{1-x}As$ alloy above the active region in the form of an elongate stripe bounded on either side by a current-blocking layer comprising InGaP, the elongate stripe defining an index-guided optical waveguide,
  wherein the stripe is formed such that at least one free end of the stripe is spaced apart from an edge of the substrate in a direction parallel to a longitudinal axis of the stripe such that a portion of the lower cladding layer, active region, current blocking layer and upper cladding layer extend beyond the at least one free end of the stripe thereby to provide an unpumped and laterally unguided window region.

Embodiments of the invention have the advantage that an interface between an end of the waveguide defined by the stripe and the window region may be formed to be of very low reflectivity. In some embodiments the reflectivity is of the order of $10^{-7}$.

Embodiments of the invention have the further advantage that during a process of fabricating the structure an Al-containing layer need not be exposed to atmosphere or any other environment leading to oxidation of the Al-containing layer. Thus a reliability of a process of fabricating structures according to embodiments of the invention is enhanced relative to a process in which exposure of Al-containing layers to atmosphere takes place.

Furthermore, a process of fabricating a structure according to an embodiment of the invention may be completed in a lower number of steps compared with a process according to some embodiments of the invention. This is because separate growth steps are not required for the window region and the active region. Rather, the portions of the structure defining the active region, lower cladding layer, current blocking layer and upper cladding layer extend laterally and continuously into the window region in an uninterrupted manner. This feature allows a further reduction in reflectivity at the interface between the active region (and the lower and upper cladding layers) and the window region.

The at least one free end of the stripe may be formed to be substantially flat as viewed in plan view. The at least one free end may be substantially planar, optionally provided in a substantially vertical plane.

Alternatively the at least one free end of the stripe may be formed to be tapered in plan view.

Providing a tapered stripe allows a further reduction in reflectivity of the interface between the stripe and the window region by allowing an optical mode propagating along the stripe to leak out from the stripe.

The at least one free end of the stripe may be formed to be substantially V-shaped in plan view.

The method may comprise the step of cleaving the structure parallel to a crystallographic facet thereby to define a free end of the stripe. Alternatively the method may comprise etching a portion of the stripe thereby to define a free end of the stripe. Etching of the stripe may be performed whereby a surface exposed by the etching process is sufficiently rough to reduce a reflectivity of the surface compared with a perfectly flat surface.

The method may comprise the step of forming the stripe whereby an angle between a longitudinal axis of the stripe and a plane defining the free end of the stripe is greater than 90° thereby to reduce an amount of light propagating along the stripe that is reflected at the free end back along the stripe.

The stripe may be formed such that each of two free ends of the stripe are spaced apart from an edge of the substrate whereby an unpumped and laterally unguided window region is provided at each end of the stripe.

The method may comprise the step of forming a plurality of electrical contacts along at least a portion of a length of the stripe thereby to allow different respective potentials to be applied to the stripe at different respective longitudinal positions.

Preferably the step of forming the upper cladding layer is preceded by the step of forming an etch stop layer above the active region.

Preferably the step of forming the upper cladding layer is preceded by the step of forming the InGaP current blocking layer and etching the current blocking layer to form a trench, subsequently filling the trench with AlGaAs alloy thereby to form the elongate stripe.

Preferably a refractive index of the AlGaAs filling the trench is arranged to be greater than a refractive index of the current blocking layer.

Thus, in the case that the current blocking layer comprises InGaP, the refractive index of the $Al_xGa_{1-x}As$ may be arranged to be greater than that of InGaP. The refractive index of InGaP is around 3.25. The refractive index of $Al_xGa_{1-x}As$ may be arranged to be up to around 3.5 or more depending on the value of x.

Alternatively a refractive index of the AlGaAs filling the trench may be arranged to be less than a refractive index of the current blocking layer.

In this case an optical mode propagating parallel to the stripe experiences anti-guiding.

x may be from around 0.1 to around 0.9, optionally from around 0.15 to around 0.8, further optionally from around 0.35 to around 0.5, still further optionally from around 0.4 to 0.44, optionally around 0.42.

In a second aspect of the invention there is provided a semiconductor light source structure comprising:
- a GaAs substrate;
- a lower cladding layer above the substrate, the lower cladding layer comprising an $Al_xGa_{1-x}As$ alloy;
- an active region above the lower cladding layer, the active region comprising a GaAs separate confinement heterostructure;
- an upper cladding layer comprising an $Al_xGa_{1-x}As$ alloy above the active region in the form of an elongate stripe bounded on either side by an InGaP current-blocking layer, the elongate stripe defining an index-guided optical waveguide,
- wherein the stripe is arranged wherein at least one free end of the stripe is spaced apart from an edge of the substrate along a direction parallel to a longitudinal axis of the stripe such that a portion of the lower cladding layer, active region, current blocking layer and upper cladding layer extend beyond a free end of the stripe thereby to provide an unpumped and unguided window region.

The at least one free end of the stripe may be formed to be substantially flat as viewed in plan view.

Alternatively the at least one free end of the stripe is formed to be tapered in plan view.

The at least one free end of the stripe may be formed to be substantially V-shaped in plan view.

A free end of the stripe may be defined by a crystallographic facet.

The stripe may be formed such that an angle between a longitudinal axis of the stripe and a plane of the facet defining the free end of the stripe is greater than 90° thereby to reduce an amount of light propagating along the stripe that is reflected by the facet back along the stripe.

The stripe may be formed such that each of two free ends of the stripe are spaced apart from an edge of the substrate whereby an unpumped and unguided window region is provided at each end of the stripe.

The structure may comprise a plurality of electrical contacts along at least a portion of a length of the stripe, the contacts being arranged to allow different respective potentials to be applied to the stripe at different respective longitudinal positions.

x may be from around 0.1 to around 0.9, optionally from around 0.15 to around 0.8, further optionally from around 0.35 to around 0.5, still further optionally from around 0.4 to 0.44, optionally around 0.42.

BRIEF DESCRIPTION OF THE DRAWINGS

Embodiments of the invention will now be described with reference to the accompanying figures in which.

DETAILED DESCRIPTION

In one embodiment of the invention a structure 200 is provided as shown in FIG. 1(b). The structure is similar to that of the known self-aligned stripe (SAS) semiconductor laser structure 100 of FIG. 1(a) in that it has a self-aligned stripe portion 202 terminated at one end by a cleaved surface 203. However, in the structure of FIG. 1(b) one free end 202F of the stripe portion 202 terminates within the lateral boundaries of the structure 200 whereby a window region 250 is provided between that free end 202F and a further cleaved facet 204 at an edge of the structure 200.

Figure 2:
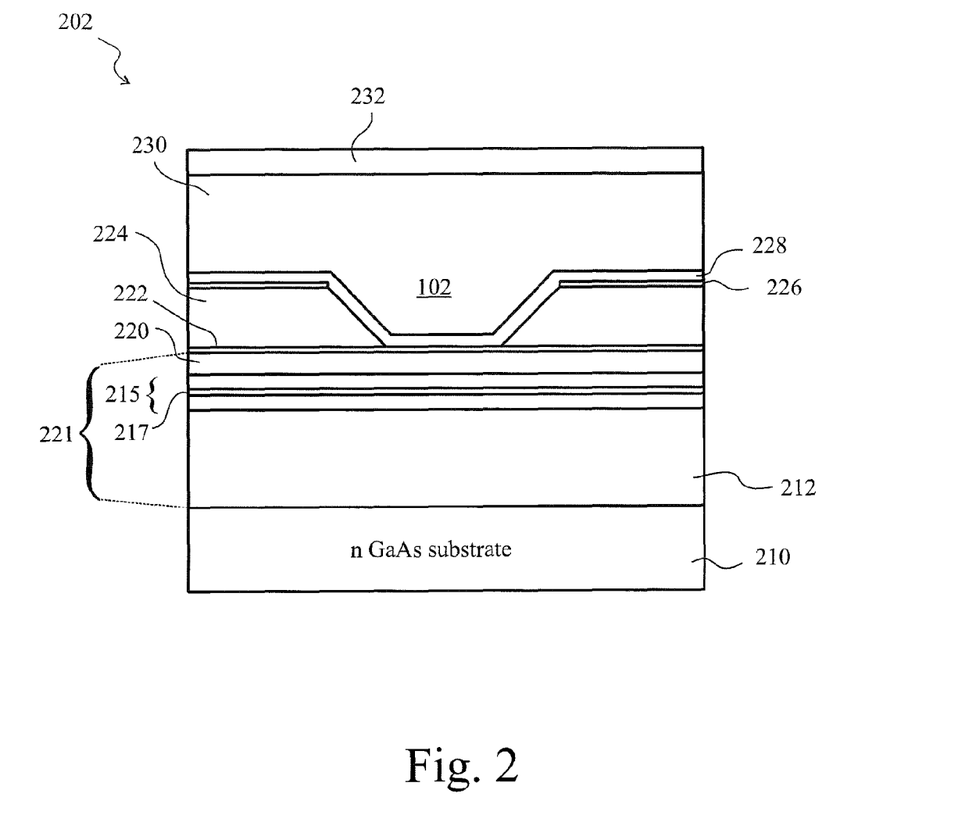
FIG. 2 is a cross-sectional view of a structure according to an embodiment of the invention.

FIG. 2 shows a cross-sectional view of the structure 200 of FIG. 1(b) along line X-X.

An example of a method of fabrication of the structure 200 will now be described with reference to FIG. 2.

In the present example a substrate 210 formed from n-doped GaAs (n-GaAs) was provided. Above the substrate a lower cladding layer 212 was formed from $Al_xGa_{1-x}As$ 1500 nm in thickness. In the present embodiment the layer was of composition $Al_{0.42}Ga_{0.58}As$. Other compositions of $Al_xGa_{1-x}As$ are also useful.

A double quantum well (DQW) separate confinement heterostructure (active region) 215 was then provided above the lower cladding layer 212. The active region 215 comprised two $In_{0.17}Ga_{0.83}As$ quantum wells 217 separated by a 20 nm thick layer of GaAs, the wells 217 being sandwiched between first and second layers of GaAs to provide an active region having a total thickness of 100 nm. Other compositions of $In_xGa_{1-x}As$ are also useful for forming the quantum wells 217.

Above the active region 215 a p-doped layer of $Al_{0.42}Ga_{0.58}As$ 220 was formed. The layer 220 was formed to be 300 nm in thickness and doped with Zn to a concentration of $5 \times 10^{17}$ cm$^{-3}$ thereby to complete a p-i-n structure 221 in which the intrinsic region was provided by the active region 215.

Above the p-doped layer 220 an etch-stop layer 222 formed from GaAs was provided. The etch-stop layer 222 was formed to have a thickness of around 10-20 nm. Other thicknesses of GaAs providing a suitable etch stop layer are also useful.

A layer of InGaP 224 600 nm in thickness was formed over the etch-stop layer 222. A mask layer 226 was then formed over the InGaP layer 224, the mask layer 226 being formed from a layer of GaAs 10 nm in thickness.

To form the self aligned stripe, the mask layer 226 was patterned and wet chemically etched ex-situ to form a narrow stripe (in the form of a trench) parallel to major flat (110). Etching was performed first with $C_6H_8O_7/H_2O_2$ to selectively etch the mask layer 226, then $H_3PO_4/HCl$ to selectively etch the InGaP layer 224 to expose the GaAs etch-stop layer 222 at the bottom of the trench.

It is to be understood that no AlGaAs is exposed during the course of the etch process.

Other methods of etching are also useful including dry etching.

A layer of GaAs 228 was then formed (or 'regrown') over the mask layer 226. Prior to growth of the GaAs layer 228 the wafer was cleaned in 1% buffered HF.

The low pressure regrowth process was performed by rapidly ramping a temperature of the structure to 690° as measured by an EpiTT pyrometer in an arsine mole fraction of $7.5 \times 10^{-3}$ before growth of the GaAs layer 228 (C-doped from $5 \times 10^{17}$ cm$^{-3}$).

An upper cladding layer 230 of $Al_{0.42}Ga_{0.58}As$ (C-doped from $5 \times 10^{17}$ to $1 \times 10^{18}$ cm$^{-3}$) 1000 nm in thickness was formed over the regrown GaAs layer 228, followed by a contact layer 232 being a layer of GaAs (C-doped, $2 \times 10^{19}$ cm$^{-3}$) 20 nm in thickness.

A AuZnAu contact metallisation was then deposited over the structure and annealed at 360°. The substrate 210 was then thinned and InGeAu back contacts deposited and annealed at 340° C.

It is to be understood that other methods of fabricating structures according to embodiments of the invention are also useful.

It is to be understood that the structure provides a p-i-n diode in a direction vertically through the structure in the region of the stripe portion 202. The upper cladding layer 230 provides a portion of the p-doped region, the active region 215 provides the intrinsic region and the lower cladding layer 212 provides the n-doped region of the p-i-n structure.

It is to be understood that a p-n-p-n current blocking structure is provided either side of the stripe region 202. Refractive index contrast between the p-i-n structure and p-n-p-n structure confines the optical mode to the active region below the stripe during propagation of the optical mode along the waveguide defined by the stripe region 202.

As stated above, in the structure 200 of FIG. 1(b) the self-aligned stripe portion 202 is not terminated at each end by a cleaved facet 203 at a free edge 210F of the substrate as in the case of the structure of FIG. 1(a) (see corresponding free edge 110F). Rather, one free end 202F of the stripe portion 202 terminates within the lateral boundaries of the structure 200 whereby a window region 250 is provided between that free end 202F and cleaved facet 204.

Figure 3:
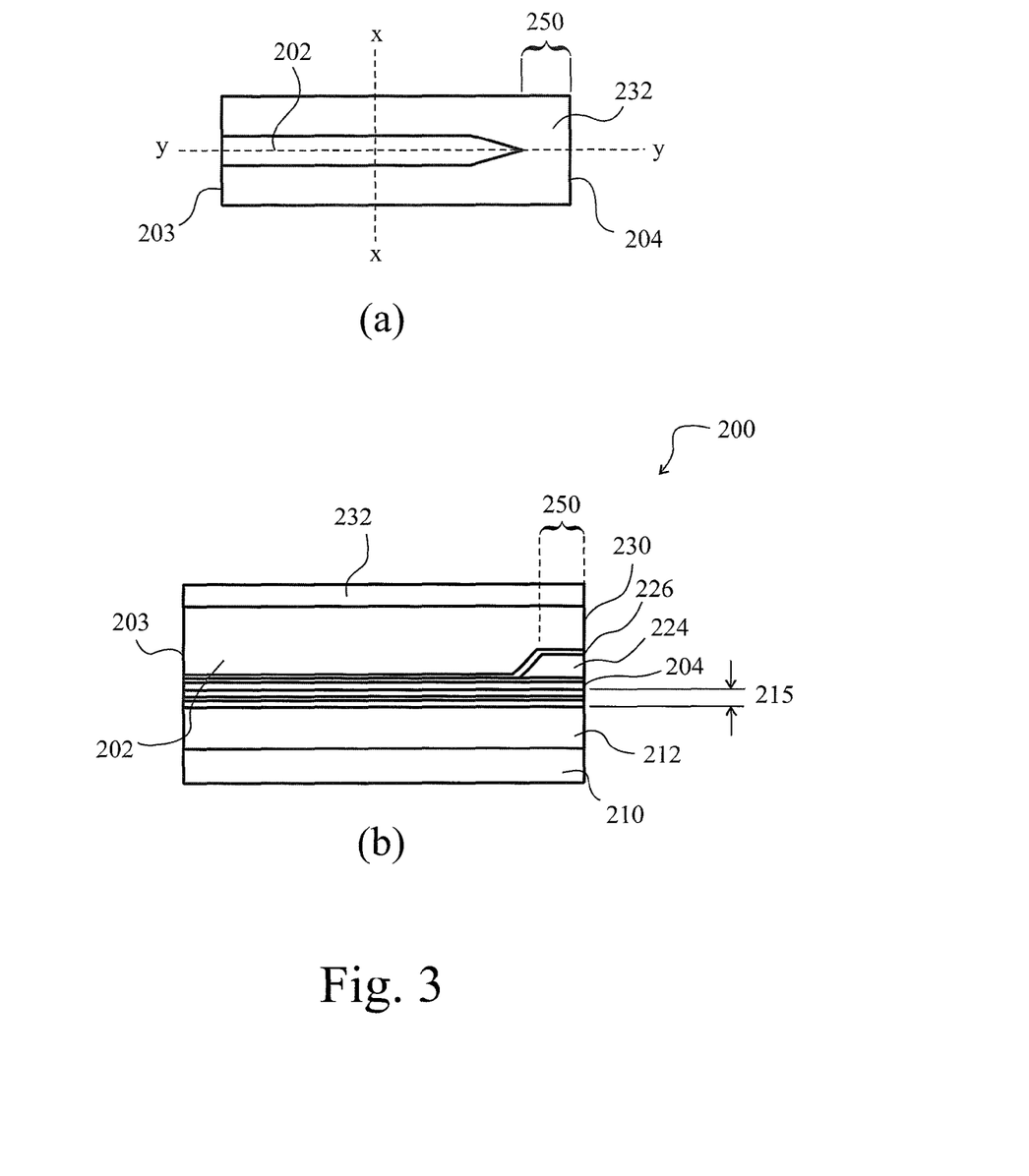
FIG. 3 shows (a) a portion of the structure of FIGS. 1(c) and (b) a cross-section through (a) along line X-X.

FIG. 3(a) reproduces a portion of FIG. 1(c) and FIG. 3(b) shows a cross-sectional view of the structure of FIG. 3(a) along line Y-Y. A cross-sectional view of the structure of FIG. 3(a) along line X-X is as shown in FIG. 2.

It can be seen from FIG. 3(b) that the window region 250 is a region of the structure 200 which is electrically unpumped and laterally unguided. The window region 250 is unpumped because electrically the structure provides a p-n-p-n structure rather than a p-i-n structure. The window region 250 is laterally unguided because the region 250 is formed substantially entirely from the p-n-p-n structure not having a variation in composition in a lateral direction.

Light propagating through the window region 250 is not amplified. Rather, the optical mode spreads out due to diffraction and is partially reflected at end facet 204. Because the active region 215 (being an optical gain region) is not removed from the window (but is simply not electrically pumped due to the presence of the current blocking layer) the window 250 is light-absorbing.

Calculations of an effective refractive index $n_{eff}$ of structures according to the embodiments of FIG. 1(b) to (e) give a value of 3.284 for a structure with a stripe portion 3 um in width and a value of 3.281 for a structure with no stripe (e.g. window region 250). Thus, a reflectivity R of an abrupt free end 202F of a stripe portion 202 at an interface between the stripe portion 202 and window region 250 may be estimated to be $\sim 10^{-7}$. This represents an improvement of around two orders of magnitude over existing low reflectivity facet technologies.

Figure 4:
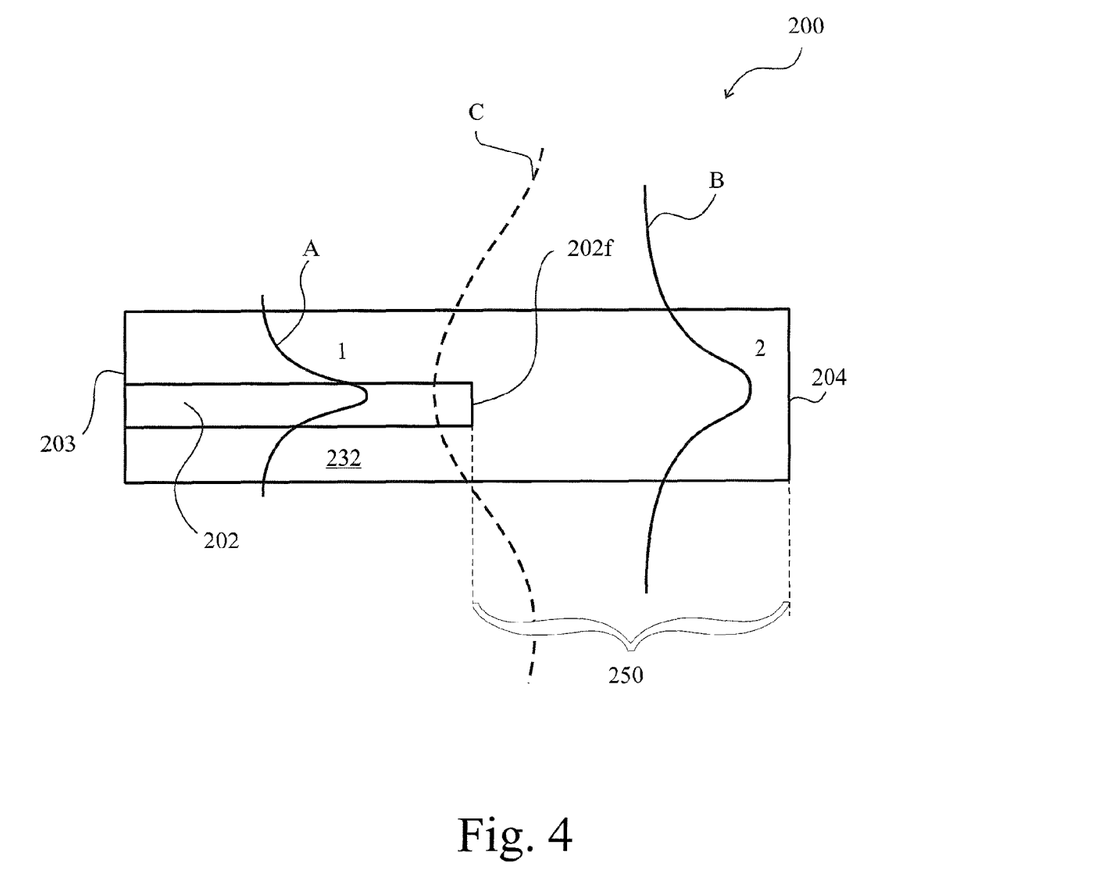
FIG. 4 shows an end portion of the structure of FIG. 1(b) showing a wavefront propagating from a waveguide defined by a stripe portion propagating from the stripe portion into a window region.

FIG. 4 shows the structure of FIG. 1(b) in which an optical wavefront is propagating along the structure 200. At position A the wavefront is propagating left to right along the waveguide defined by the stripe portion 202. At position B the wavefront has exited the stripe portion 202 and is propagating through the window region 250. As discussed above, in the window region 250 the wavefront is unguided and the device unpumped. The wavefront spreads out due to diffraction and is to a certain extent absorbed by the window region 250.

A portion of the light passing left to right along the window region 250 is reflected by end facet 204 and propagates back along the structure 200 from right to left where it continues to spread out. It can be seen that only a small proportion of the reflected wavefront propagating back along the structure at position C is within the pumped stripe portion 202. Thus a contribution of this wavefront to stimulated emission within the pumped region is small. This reduces a risk that lasing is established in the stripe portion 202.

In some embodiments, the free end 202F of the stripe portion 202 is tapered thereby further reducing a reflectivity of the free end 202F. FIG. 1(c) shows such an embodiment in which a stripe region 302 has a tapered free end 302F. Tapering of the stripe region 302 allows the optical mode to leak out from the waveguide defined by the stripe portion 302 further reducing an amount of coupling back into the waveguide. The tapered structure also offers reduced far-field divergence, improving fibre coupling efficiency.

In the embodiment of FIG. 1(d) the stripe portion 402 is tilted through an angle θ (i.e. rotated about an axis normal to a plane of substrate 410) in order to reduce a reflectivity of end facet 403. In the embodiment of FIG. 1(e) the stripe portion 502 is tilted and provided with a taper at both free ends 502F, 502F'. Corresponding window regions 550, 550' are provided at each end of the stripe portion 502.

It is to be understood that in some embodiments in which long window regions are provided a coupling efficiency of the structure to an optical fibre may be degraded.

In some embodiments an anti-reflection (AR) coating is provided on an exposed facet 203, 204 of a structure in order to further reduce a reflectivity of the facet. The facet 203, 204 may be a facet at an edge of a window region 250 or a stripe portion 202.

In some embodiments the window is arranged to be a substantially 'infinitely long absorber'. By infinitely long absorber is meant that a product of an absorption coefficient α of the window region and a length of the window region L is much greater than 1, αL≫1.

In some embodiments of the invention a reflectivity of end facets of the structure (and of one or both free ends of the stripe region within the structure depending on whether one or both free ends of the stripe terminate within the structure) is sufficiently low to allow the stripe to be fabricated parallel to a crystallographic axis or major crystallographic axis of the substrate (i.e. the stripe is untilted, θ being substantially zero, see FIG. 1(d)). This has the advantage that a yield of devices may be increased compared with tilted waveguide devices.

Embodiments of the present invention have the advantage that an SLD or SOA device may be formed having a window region having a reduced reflectivity. Furthermore embodiments of the invention allow a GaAs-based device to be fabricated in which exposure of Al-containing layers to atmosphere during a course of fabricating the device may be avoided. Thus, a reliability of a manufacturing process of an SLD or SOA structure is greatly enhanced. Some embodiments of the present invention allow the number of processing steps required to provide a SLD or SOA device to be reduced relative to prior art SLD or SOA devices.

Example

An SLD device according to the embodiment of FIG. 1(b) was fabricated having an emission wavelength centred at around 1060 nm. The SLD device was 4 mm long. The stripe portion of the structure had a cleaved facet at one end and a window region 500 um long at the other end. No lasing was observed even at a current flow of 1 A indicating the effectiveness of the window structures of embodiments of the present invention.

Figure 5:
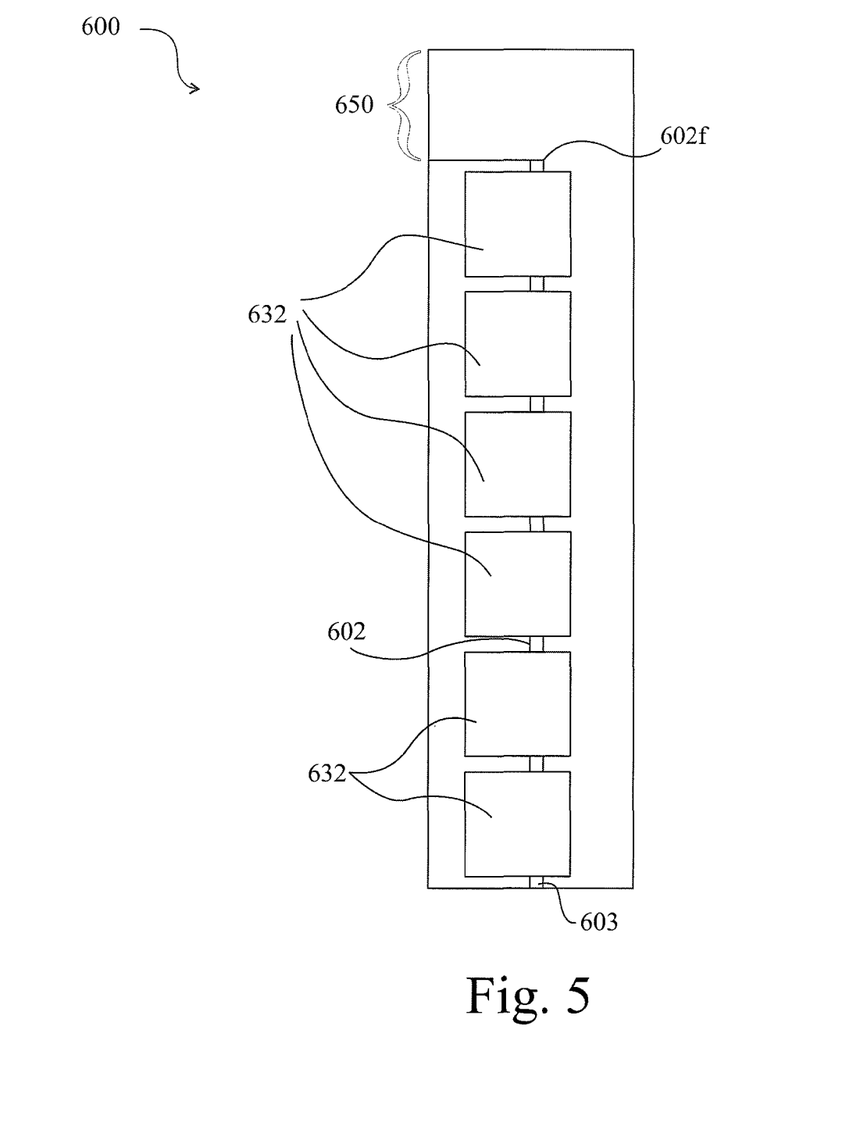
FIG. 5 shows a schematic plan view of a structure according to an embodiment of the invention having a plurality of electrical contacts formed over a stripe portion of the structure.

FIG. 5 shows a structure according to an embodiment of the invention in which contact layer 632 has been etched to allow multiple mutually isolated contacts to be formed along a length of the stripe portion 602. This allows different potentials to be applied to different regions as appropriate in order to optimise a performance of the structure.

In some embodiments one or more contacts may be reverse biased in order to increase an absorption of one or more sections of the structure. In some embodiments a contact 632 is provided above a portion of the window region 650.

In some embodiments the contacts are defined by implantation into a contact layer 232 rather than by etching of the contact layer 232.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. A method of fabricating a superluminescent diode or semiconductor optical amplifier structure comprising:
   providing a GaAs substrate;
   forming a lower cladding layer above the substrate, the lower cladding layer comprising an $Al_xGa_{1-x}As$ alloy;
   forming an active region above the lower cladding layer, the active region comprising a GaAs separate confinement heterostructure;
   forming a stripe and an upper cladding layer comprising an $Al_xGa_{1-x}As$ alloy above the active region, the stripe in the form of an elongate stripe bounded on either side by an InGaP current-blocking layer, the elongate stripe defining an index-guided optical waveguide,
   wherein the stripe has at least one free end, each free end of the stripe being spaced apart from an edge of the substrate in a direction parallel to a longitudinal axis of the stripe such that a portion of the lower cladding layer, active region, current blocking layer and upper cladding layer extend beyond the at least one free end of the stripe in the direction parallel to the longitudinal axis of the stripe thereby to provide an unpumped and laterally unguided window region.

2. A method as claimed in claim 1 wherein the at least one free end of the stripe is formed to be substantially planar.

3. A method as claimed in claim 1 wherein the at least one free end of the stripe is formed to be tapered in plan view.

4. A method as claimed in claim 3 wherein the at least one free end of the stripe is formed to be substantially V-shaped in plan view.

5. A method as claimed in claim 1 comprising the step of cleaving the structure to form a crystallographic facet such that the window region is between the free end of the stripe and the crystallographic facet.

6. A method as claimed in claim 5 comprising the step of forming the stripe whereby an angle between a longitudinal axis of the stripe and a plane of the facet defining the free end of the stripe is greater than 90°.

7. A method as claimed in claim 1 wherein the stripe has two free ends, and each of two free ends of the stripe are spaced apart from an edge of the substrate whereby an unpumped and laterally unguided window region is provided at each end of the stripe.

8. A method as claimed in claim 1 comprising the step of forming a plurality of electrical contacts along at least a portion of a length of the stripe thereby to allow different respective potentials to be applied to the stripe at different respective longitudinal positions.

9. A method as claimed in claim 1 wherein the step of forming the upper cladding layer is preceded by the step of forming an etch stop layer above the active region.

10. A method as claimed in claim 1 wherein the step of forming the upper cladding layer is preceded by the step of forming the InGaP current blocking layer and etching the current blocking layer to form a trench, subsequently filling the trench with AlGaAs alloy thereby to form the elongate stripe.

11. A method as claimed in claim 10 wherein a refractive index of the AlGaAs filling the trench is arranged to be greater than a refractive index of the current blocking layer.

12. A method as claimed in claim 10 wherein a refractive index of the AlGaAs filling the trench is arranged to be less than a refractive index of the current blocking layer.

13. A method as claimed in claim 1 wherein x is in the range of one selected from amongst from 0.1 to 0.9, from 0.15 to 0.8, from 0.35 to 0.5, from 0.4 to 0.44.

14. A method as claimed claim 1 comprising the step of providing an anti-reflection coating over at least one facet of the structure at an edge of the window region.

15. A superluminescent diode or a semiconductor optical amplifier structure comprising:
   a GaAs substrate;
   a lower cladding layer above the substrate, the lower cladding layer comprising an $Al_xGa_{1-x}As$ alloy;
   an active region above the lower cladding layer, the active region comprising a GaAs separate confinement heterostructure;
   a stripe and an upper cladding layer comprising an $Al_xGa_{1-x}As$ alloy above the active region, the stripe in the form of an elongate stripe bounded on either side by an InGaP current-blocking layer, the elongate stripe defining an index-guided optical waveguide,
   wherein the stripe has at least one free end, each free end of the stripe being spaced apart from an edge of the substrate along a direction parallel to a longitudinal axis of the stripe such that a portion of the lower cladding layer, active region, current blocking layer and upper cladding layer extend beyond a free end of the stripe in the direction parallel to the longitudinal axis of the stripe thereby to provide an unpumped and laterally unguided window region.

16. A structure as claimed in claim 15 wherein the at least one free end of the stripe is substantially planar.

17. A structure as claimed in claim 15 wherein the at least one free end of the stripe is tapered in plan view.

18. A structure as claimed in claim 17 wherein the at least one free end of the stripe is substantially V-shaped in plan view.

19. A structure as claimed in claim 15 wherein an edge of the structure has a crystallographic facet, and the window region is between the free end of the stripe and the crystallographic facet.

20. A structure as claimed in claim 19 wherein an angle between a longitudinal axis of a plane of the facet defining the free end of the stripe is greater than 90°.

21. A structure as claimed in claim 15 wherein the stripe has two free ends, and each of two free ends of the stripe are spaced apart from an edge of the substrate, whereby an unpumped and laterally unguided window region is provided at each end of the stripe.

22. A structure as claimed in claim 15 comprising a plurality of electrical contacts along at least a portion of a length of the stripe portion, the contacts being arranged to allow different respective potentials to be applied to the stripe portion at different respective longitudinal positions.

23. A structure as claimed in claim 15 comprising an anti-reflection coating over at least one facet of the structure at an edge of the window region.

24. A structure as claimed in claim 15, further comprising a trench in the InGaP current blocking layer, the trench being tilled with AlGaAs alloy thereby to form the elongate stripe.

25. A structure as claimed in claim 24 wherein a refractive index of the $Al_xGa_{1-x}As$ filling the trench is arranged to be greater than a refractive index of the current blocking layer.

26. A structure as claimed in claim 24 wherein a refractive index of the $Al_xGa_{1-x}As$ filling the trench is arranged to be less than a refractive index of the current blocking layer.

27. A structure as claimed in claim 24 wherein x is in the range of one selected from amongst from 0.1 to 0.9, from 0.15 to 0.8, from 0.35 to 0.5 and from 0.4 to 0.44.

\* \* \* \* \*